US006966018B2

(12) United States Patent
Hilliges

(10) Patent No.: US 6,966,018 B2
(45) Date of Patent: Nov. 15, 2005

(54) INTEGRATED CIRCUIT TESTER WITH MULTI-PORT TESTING FUNCTIONALITY

(75) Inventor: Klaus-Dieter Hilliges, San Francisco, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 361 days.

(21) Appl. No.: 09/870,955

(22) Filed: May 30, 2001

(65) Prior Publication Data

US 2002/0070725 A1 Jun. 13, 2002

(30) Foreign Application Priority Data

Jun. 16, 2000 (EP) .................................. 00112808

(51) Int. Cl.[7] ............................................ G01R 31/28
(52) U.S. Cl. ...................................................... 714/724
(58) Field of Search ............................... 714/724, 738, 714/734

(56) References Cited

U.S. PATENT DOCUMENTS

| | | | | |
|---|---|---|---|---|
| 5,461,310 A | * | 10/1995 | Cheung et al. | 324/158.1 |
| 5,944,846 A | * | 8/1999 | Fournel et al. | 714/724 |
| 6,028,439 A | | 2/2000 | Arkin et al. | 324/765 |
| 6,076,179 A | | 6/2000 | Hendricks et al. | 714/742 |
| 6,353,904 B1 | * | 3/2002 | Le | 714/726 |
| 6,557,128 B1 | * | 4/2003 | Turnquist | 714/724 |

FOREIGN PATENT DOCUMENTS

EP       0 474 275       3/1992

OTHER PUBLICATIONS

Cheung et al., "Tester for multiple integrated circuit—produces sequence of test signals and has programmable memory for storing independent sequence", Copyright 1999 Derwent Information Ltd, Derwent-Week: 200246.*

* cited by examiner

Primary Examiner—Joseph D. Torres

(57) ABSTRACT

Automated test equipment (ATE) includes a tester-per-pin architecture with a number of individual decentralized per-pin testing units, wherein each per-pin testing unit is adapted for testing a respective DUT-pin of a device under test (DUT) by emitting stimulus response signals to the respective DUT-pin and/or receiving stimulus response signals from the respective DUT-pin. Testing the DUT includes defining for a testing sequence the DUT into one or more DUT-cores representing one or more functional units of the DUT and covering one or more DUT-pins of the DUT, and assigning during the testing sequence one or more of the per-pin testing units to one or more ATE-ports, whereby each ATE-port comprises one or more of the per-pin testing units and represents an independent functional testing unit for testing one or more of the DUT-cores during the testing sequence.

13 Claims, 6 Drawing Sheets

| Vec # | Pins | | | | Sequencer Instruction |
|---|---|---|---|---|---|
| | D0 | ... | D15 | Dmux | |
| 0 | X | ... | X | 0 | CORE 1"SI1_Data"<br>CORE 2"SO1_Data" |
| 1 | p | | p | 1 | LOOP 10000;<br>COREDATA 1 |
| 2 | X | | X | 1 | |
| 3 | p | | p | 1 | COREDATA 2 |
| 4 | X | | X | 1 | |
| | | | | | LOOP END |

Fig. 10

INTEGRATED CIRCUIT TESTER WITH MULTI-PORT TESTING FUNCTIONALITY

BACKGROUND OF THE INVENTION

The present invention relates to testing of integrated circuits with automated test equipment.

Integrated Circuits (IC) generally need to be tested to assure proper operation. This—in particular—is required during IC development and manufacturing. In the latter case, the ICs are usually tested before final application. During test, the IC, as a device under test (DUT), is exposed to various types of stimulus signals, and its responses are measured, processed and usually compared to an expected response of a good device. Automated test equipment (ATE) usually performs these tasks according to a device-specific test program.

During test, each pin of the DUT that is relevant for this test is connected to the ATE's pin electronic. There are generally two types of ATEs: one type with centralized resources and another type with decentralized resources based on a per-pin architecture. In the latter case, the resources on the per-pin basis further comprise some central resources, in particular for centrally controlling the sequence and period of applied test stimulus vectors. The per-pin architecture generally enables high performance and scalability at acceptable costs. Examples for ATE with per-pin architecture are the Agilent 83000 and 93000 families of Semiconductor Test Systems of Agilent Technologies. Details of those families are also disclosed e.g. in EP-A-859318, EP-A-864977, EP-A886214, EP-A-882991, U.S. Pat. Nos. 5,499,248, 5,453,995.

The semiconductor industry is characterized by an ever-increasing integration of capabilities on a single IC. In the last years, ICs can be designed encompassing virtually all functions that constitute a complete (end-user) system. Such devices are generally called systems on a chip (SOC). A typical SOC integrates a set of analogous, digital, or memory DUT-cores that are used in multiple designs in order to gain design productivity. The term 'DUT-core' as used herein shall generally represent an architectural component within an IC (as DUT) that is characterized by an interface that is specified in terms of a set of input and output signals, signal timing conditions and a behavioral model (much like an independent device). Increasingly, SOCs are designed hierarchically, i.e. fully designed DUT-cores are integrated into the SOC.

FIG. 1 shows an example of an SOC with internal and peripheral DUT-cores. In this example, the SOC 10 comprises, as internal DUT-cores 15, a Random Access Memory (RAM) 20, a Read-Only Memory (ROM) 30, a Micro Processor Unit (MPU) 40, a Digital Signal Processor (DSP) 50, and an Graphics Processor Unit (GPU) 60. As peripheral DUT-cores, the SOC 10 in this example comprises a Local Area Network (LAN) module 70, a flat panel interface 80, an audio block 90, a Dynamic Random Access Memory (DRAM) 100, an Universal Serial Bus (USB) 110, a High-Speed Serial Interface (HSS) 120, and a scalability bus 130 (e.g. an Advanced Graphics ATE-port—AGP). The SOC 10 in the example of FIG. 1 integrates all major functions and interfaces of a personal computer (PC) and could be applied for a highly-integrated notebook.

DUTs become increasingly complex internally, while the bandwidth (as the product of the number of signal pins and the data rate) of a DUT-interface does not increase correspondingly. The DUT-interface refers to all signal pins of the DUT that are used for communication with the environment of the DUT and specifically for testing the DUT. Since the test stimulus and response data have to flow through the DUT interface, the testing time and thus the related testing cost for testing SOCs become excessive.

SUMMARY OF THE INVENTION

It is an object of the present invention to provide an improved test equipment (ATE) which in particular addresses the increase of test costs relative to overall costs of integrated circuit (ICs).

The object is solved by the independent claims. Preferred embodiments are shown by the dependent claims.

The invention utilizes an automated test equipment (ATE) with a tester-per-pin architecture having multiple individual per-pin testing units, so that each DUT-pin of a device under test (DUT) can be addressed by a decentralized per-pin testing unit, which again might receive stimulus response signals from the respective DUT-pin. For each testing sequence, the DUT is defined into one or more DUT-cores that might represent one or more functional units of the DUT and might be accessible through one or more DUT-pins of the DUT. To each DUT-core of the DUT, the ATE assigns one or more ATE-ports. Each ATE-port covers one or more per-pin testing units and represents an independent testing unit within the ATE.

The DUT can then be tested in that each ATE-port assigned to a respective DUT-core will test this DUT-core (i.e. one or more pins of the DUT connecting to a functional unit). Since the ATE-ports represent independent functional units within the ATE, the testing of all addressed DUT-cores in the DUT can be provided not only serially, i.e. the DUT-cores are tested successively, but also in parallel, i.e. more than one DUT-core will be tested concurrently.

The term "testing sequence" as used herein shall mean a temporal unit wherein the assignment of ATE-ports to DUT-cores remains unchanged. That does not necessarily mean that the assignment ATE-ports to DUT-cores has to be maintained unchanged as long as a specific test is executed. It is clear that by employing systems such as time-multi-plexing of per-pin testing units for testing multiple DUT-cores successively, the ATE-ports may 'overlap'. However, during a single 'timeslot' in a testing sequence, each ATE-port is clearly assigned to one or more specific DUT-cores. In other word, during such a timeslot, each 'ATE-pin' of the ATE is clearly assigned for testing one or more DUT-cores through one specific DUT-pin.

The term 'ATE-pin' as used herein shall not only mean an electrical contact of an individual per-pin testing unit, but shall also—dependent on the specific context—represent the individual per-pin testing unit itself. Accordingly, the term 'DUT-pin' as used herein shall not only mean an electrical contact of the DUT, but shall also—dependent on the specific context—represent the respective functionality of the DUT accessible through that DUT-pin.

It is to be understood that changing the assignment of ATE-ports to DUT-cores can be done physically, i.e. by switching physical connections between ATE-pins and DUT-pins (e.g. employing switches and/or multiplexers), as well as virtually, i.e. without changing physical connections between ATE-pins and DUT-pins (e.g. employing adequate software tools). Physically changing the assignment is currently applied mainly for testing analogue DUTs or DUT-cores. Correspondingly, virtually changing the assignment is currently applied mainly for testing digital DUTs or DUT-cores. It is clear that the invention can be applied to both or other corresponding concepts either separately or in combination.

The invention enables to reconfigure the ATE per-pin testing units to belong to one ATE-port from one test to the other. For each ATE-port, the timing and stimulus/response pattern can be defined and programmed independently, as if the set of DUT-pins assigned to an ATE-port would constitute a device in itself. Preferably, each ATE-port's test condition can specify:

a cycle time (period) of a stimulus and response vector for the ATE-port;

a per-pin timing in terms of sets of available waveforms for each ATE-pin, whereby each waveform represents a sequence of events of various types occurring at specified instances in time;

a pattern program: e.g. a sequencer program of the ATE-port (e.g. instructions to loop test vectors or for conditional branching as typical for random logic tests) or an algorithmic pattern generator (APG) program of the ATE-port (typically for memory tests);

a per-pin vector data for each pin of the ATE-port; and/or analogue set-up conditions for analogue pins of the ATE-port.

The invention further allows specifying overall test conditions for a test that concurrently operates on multiple ATE-ports, preferably:

determining a set of concurrently active ATE-ports during a defined testing sequence;

selecting the ATE-port test conditions for one or more ATE-pins: e.g. an ATE-port timing setup for one or more ATE-pins;

if necessary, specifying global test conditions to express dependencies between pins of the DUT and the ATE: e.g. global DUT specifications; and/or determining a multi-port pattern burst that defines a sequence of per-ATE-port pattern programs for each ATE-port.

Based on the overall test conditions of a test execution, the invention can check the consistency of the test conditions for each ATE-pin: e.g. whether any hardware limitations are exceeded. Also, the complete test setup can be downloaded prior to testing a first DUT with rapid activation of the particular test setup during production test.

The invention thus allows that there is substantially no limitation to the amounts of configured ATE-ports concurrently used for testing, whereby a single per-pin testing unit may already constitute one ATE-port. Also, there are no limitations to the granularity of assigning per-pin testing units to ATE-ports, so that each per-pin testing unit can be freely assigned to an ATE-port while existing solutions generally require blocks of per-pin testing units (e.g. 64) to be assigned commonly.

The invention thus enables parallel testing of multiple independently accessible DUT-cores within a system on a chip (SOC). The invention further improves the utilization of available DUT interface bandwidth by enabling ATE-port vector rates and sequencer/APG programs optimized according to the tested DUT-core only—independently from concurrently tested ATE-ports.

It is clear that the invention can be partly or entirely embodied or supported by one or more suitable software programs, which can be stored on or otherwise provided by any kind of data carrier, and which might be executed in or by any suitable data processing unit.

BRIEF DESCRIPTION OF THE DRAWINGS

Other objects and many of the attendant advantages of the present invention will be readily appreciated and become better understood by reference to the following detailed description when considering in connection with the accompanied drawings. Features that are substantially or functionally equal or similar will be referred to with the same reference sign(s).

FIG. 10 depicts an example of a main pattern that implements the concurrent DUT-core access for two DUT-cores by switching the ATE-port configuration from one testing sequence to another.

DETAILED DESCRIPTION OF THE INVENTION

The invention introduces two kinds of concepts that allow describing a multi-port test setup:

1. Per-ATE-port concepts allowing to describe test conditions specific to ATE-ports—i.e. specific to a set of ATE-pins that are connected to a subset of DUT-pins as if the DUT-pins constituted an individual DUT in itself, e.g.:
   a. the ATE-port definition itself, which assigns (e.g. digital or analog) ATE resources to DUT-pins (cf. Chapter 1 as below),
   b. timing conditions for each ATE-port (cf. Chapter 2 as below),
   c. stimulus and response pattern programs for each ATE-port (cf. Chapter 3 as below).

2. ATE-port global concepts allowing to integrate test conditions for each ATE-port into a multi-port test setup that is active during a testing sequence, e.g.:
   a. specification blocks referencing the timing conditions for each ATE-port (cf. Chapter 2 as below),
   b. pattern bursts referencing the pattern programs for each ATE-port (cf. Chapter 3 as below).

As analog test resources of an ATE are normally programmed individually without interdependence with other resources, no considerations shall be made herein regarding a concept for determining test conditions for these resources on a per-ATE-port basis.

Other per-ATE-port concepts may ease reuse of entire tests by tying the setup of a subset of ATE-pins together, e.g.: per-ATE-port I/O and termination voltages (e.g. of a Rambus ATE-port), or per-ATE-port test procedures enabling parallel test execution—much like for a multi-processor workstation (e.g. executing a redundancy repair test for an embedded memory DUT-core while performing an analog capture test with post-processing the results).

The following three chapters introduce—in more detail—the aforementioned concepts according to the invention. The fourth chapter introduces a fictitious SOC device as an example application for multi-port tests. The fifth chapter provides implementation details based on the fictitious multi-port test application introduced in Chapter 4.

Chapter 1: ATE-Port Definition

Figure 1:
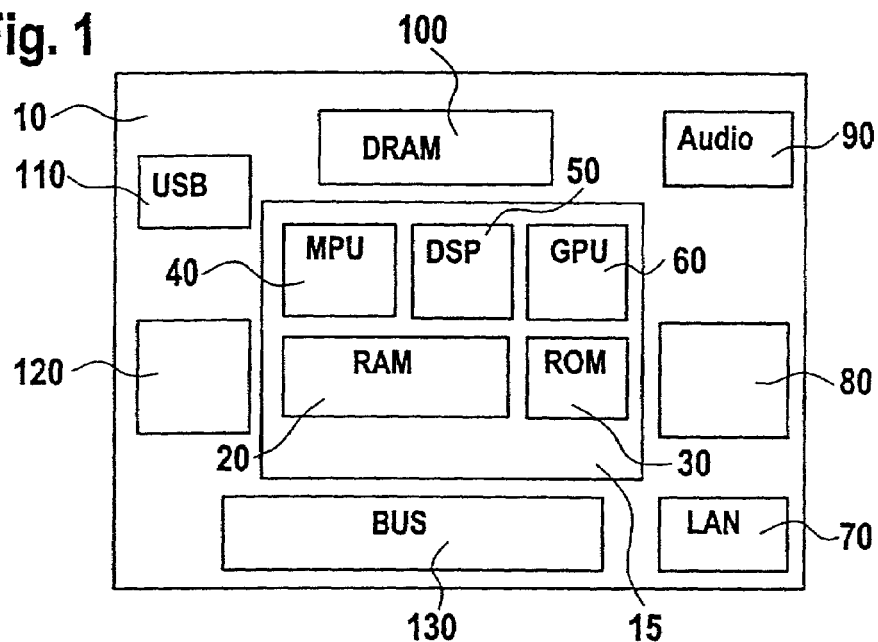
FIG. 1 shows an example of an SOC with internal and peripheral DUT-cores, as known in the art.
Figure 2:
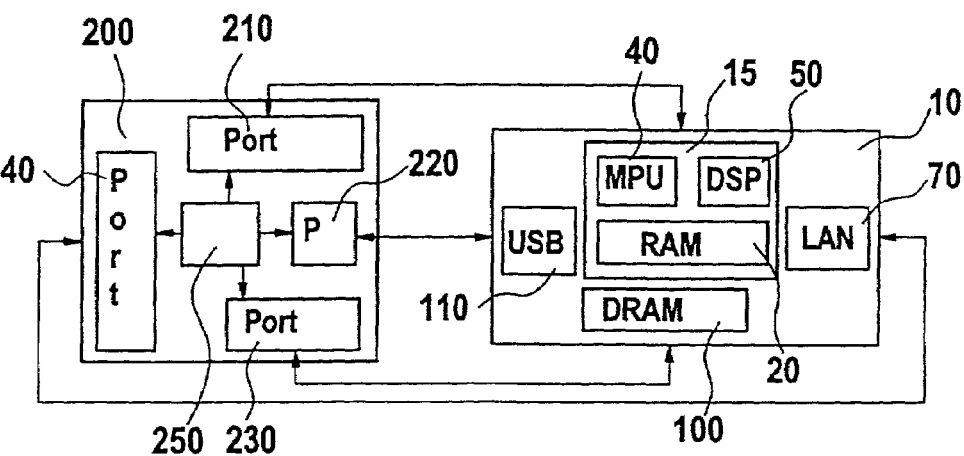
FIG. 2 shows an example of an ATE 200, according to the invention, having multiple ATE-ports configured to concurrently test several independent peripheral or internal DUT-cores.

FIG. 2 shows an example of an ATE 200 having multiple ATE-ports configured to concurrently test several independent peripheral or internal DUT-cores. In this example, the DUT 10 comprises as internal DUT-cores 15 the MPU 40, the DSP 50 and the RAM 20 (cf. also FIG. 1). As peripheral DUT-cores, the DUT 10 comprises the LAN 70, the DRAM 100, and the USB 110.

For testing the DUT 10, the ATE 200 having a tester-per-pin architecture comprises a plurality of individual per-pin testing units (not shown in detail in FIG. 2), each allowing to provide a stimulus signal to a specific pin of the DUT 10 and to receive a stimulus response therefrom. For testing the internal DUT-cores 15 (i.e. units 40, 50, and 20) of the DUT 10, the ATE 200 assigns an ATE-port 210 as a specific subset of individual per-pin testing units for testing the functionality of the internal DUT-cores 40, 50, and 20. Accordingly, the ATE 200 further provides an ATE-port 220 for testing the USB 110, an ATE-port 230 for testing the DRAM 100, and an ATE-port 240, for testing the LAN 70, each ATE-port having a specific subset of individual per-pin testing units.

A clock generator 250 in FIG. 2 represents, on one hand, a central digital clock source routed to each per-pin testing unit. On the other hand, it may (conceptually) represent any resource that is central for all per-pin resources. As such, it limits the multi-ATE-port tests to test conditions that can be enabled based on a single setup for the central resources: e.g. a single period of a central digital master clock.

Figure 3:
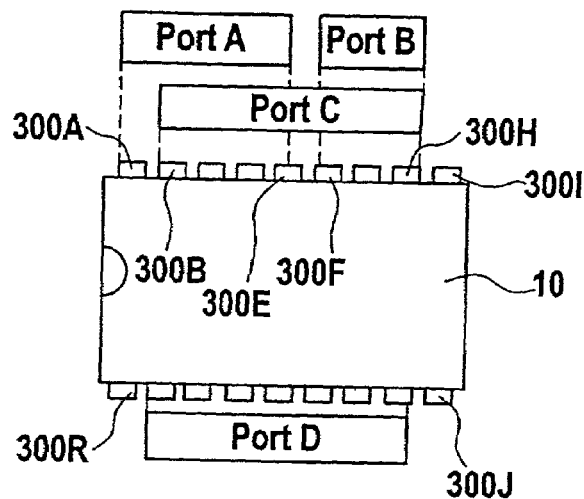
FIG. 3 shows the DUT 10 with examples of ATE-port assignments to pins of the DUT 10.

FIG. 3 shows—from a different angle than FIG. 2—the DUT 10 with examples of ATE-port assignments to pins of the DUT 10. In this example, the DUT 10 comprises individual DUT-pins 300A, 300B, . . . , 300R, each DUT-pin representing an external electrical contact which can be accessed by an individual per-pin testing unit. For a first testing sequence, the DUT-pins 300A to 300E are assigned to an ATE-port A, the DUT-pins 300F to 300H are assigned to an ATE-port B, and the DUT-pins 300K to 300Q are assigned to an ATE-port D. In a next testing sequence, the ATE-ports 300B to 300H are assigned to an ATE-port C instead of the assignments A and B. While the ATE-ports A and B may be concurrently used for testing, the ATE-port C can only be used independently of ATE-ports A and B.

Chapter 2: Per-ATE-Port Timing and ATE-Port Global Specification Block

Figure 4:
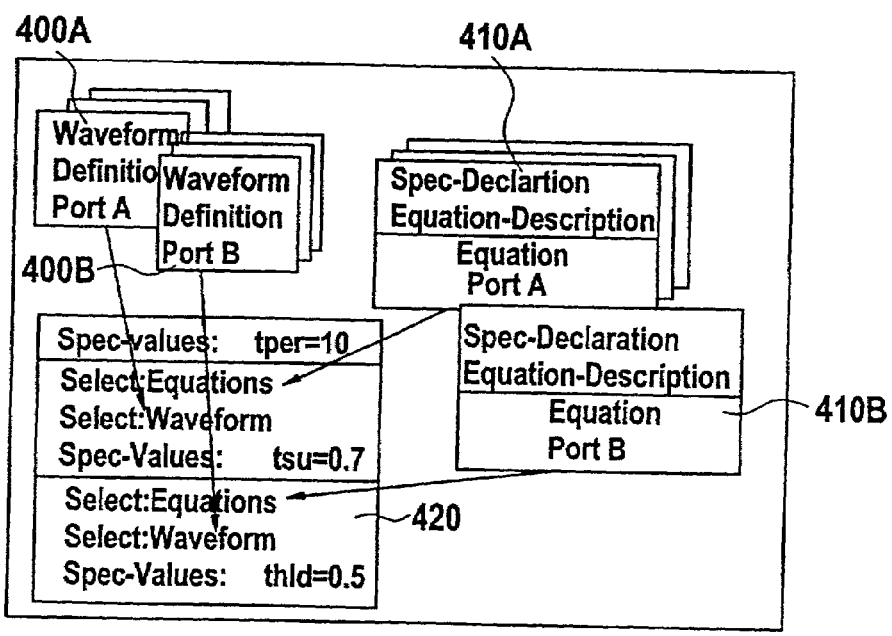
FIG. 4 depicts the overall timing conditions of a test with two ATE-ports A and B.

FIG. 4 depicts the overall timing conditions of a test with two ATE-ports A and B. The timing conditions, in this example, are specified as following:
a. Providing for the ATE-port A per-ATE-port waveform definitions 400A and equation blocks 410A, and for the ATE-port B per-ATE-port waveform definitions 400B and equation blocks 410B. The waveform definitions 400 and equation blocks 410 are specified as if the ATE-pins of the respective ATE-port A or B were input/output signals of a small virtual device. These per-ATE-port waveform definitions 400 and equation blocks 410 are fully independent from other ATE-ports (than the ATE-ports A and B) and the device as a whole, hence can be reused for other multi-ATE-port tests or even other SOC devices with the same DUT-port.
b. Within a specification block 420, selecting the per-ATE-port waveform definition 400 and the equation blocks 410 to be activated concurrently.
c. Within the specification block 420, defining ATE-port-specific values for external variables (specification values) of the equation blocks 410.
d. Within the specification block 420, defining DUT-global values for external variables that are common to multiple per-ATE-port equation blocks (e.g. "tper=10", whereby "tper" represents an ATE-port global operation period of the device, while "tsu" represents a setup time specific to ATE-port A and "thld" represents a hold time specific to ATE-port B).

Chapter 3: Per-ATE-Port Pattern Programs and ATE-Port Global Multi-Port Burst

Figure 5:
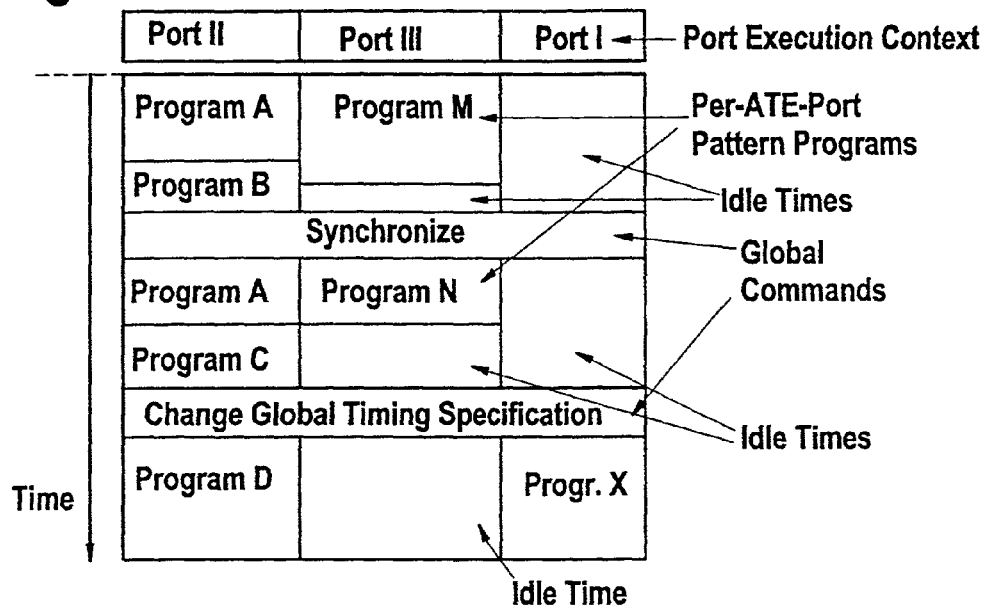
FIG. 5 depicts an example of a pattern execution of a test with three ATE-ports I–III.

FIG. 5 depicts an example of a pattern execution of a test with three ATE-ports I–III, wherein the concurrent execution of per-ATE-port pattern programs for the three ATE-ports is specified by an ATE-port global multi-port burst.

An ATE-port pattern program is either a sequencer program and vector data for a random logic test or an algorithmic pattern generator (APG) program for testing a memory DUT-core. The ATE-port pattern program is specified as if the DUT-pins connected to the per-pin testing units of the ATE-port were input/output signals of a small virtual device. It is fully independent from other ATE-port pattern programs, hence can be reused for other multi-ATE-port tests or even other SOC devices with the same DUT-port. In the example of FIG. 5, seven different ATE-port pattern programs A–D, M, N, and X are specified for the three ATE-ports I–III.

A multi-port burst is an ATE-port global concept to integrate the per-ATE-port pattern programs into the overall pattern execution for a test. A multi-port burst specifies:
a. The ATE-port execution context that refers to the set of concurrently active ATE-ports during pattern execution.
b. A sequence of per-ATE-port pattern programs for each ATE-port. In the example of FIG. 5, the sequence for ATE-port I is only ATE-port pattern program X. For ATE-port II, the sequence of ATE-port pattern programs is A, B, A, C, and D. For ATE-port III, the sequence of ATE-port pattern programs is M and N.
c. Global sequencing commands for synchronizing the execution across ATE-ports. These commands may modify global test conditions as for example DUT-global timing specifications.
d. The behavior of an ATE-port when idling: e.g. a repeated sequence of vectors or a constant state. If not specified within the multi-port burst the idling behavior is determined by a fill-waveform described in the waveform definition that was selected in the specification block.

The execution times of independent per-ATE-port pattern programs may vary. Therefore, idle times may occur for ATE-ports until either a synchronization command occurs or until all per-ATE-port pattern programs are finished. In the example of FIG. 5, idle times are—for ATE-port III—after executing ATE-port pattern program M and before synchronizing, and after executing ATE-port pattern program N and before changing global timing specifications. For ATE-port I, idle times are before executing ATE-port pattern program X. No idle times are required for ATE-port II.

Chapter 4: Multi-Port Approach to Testing a Fictitious SOC Device

Figure 6:
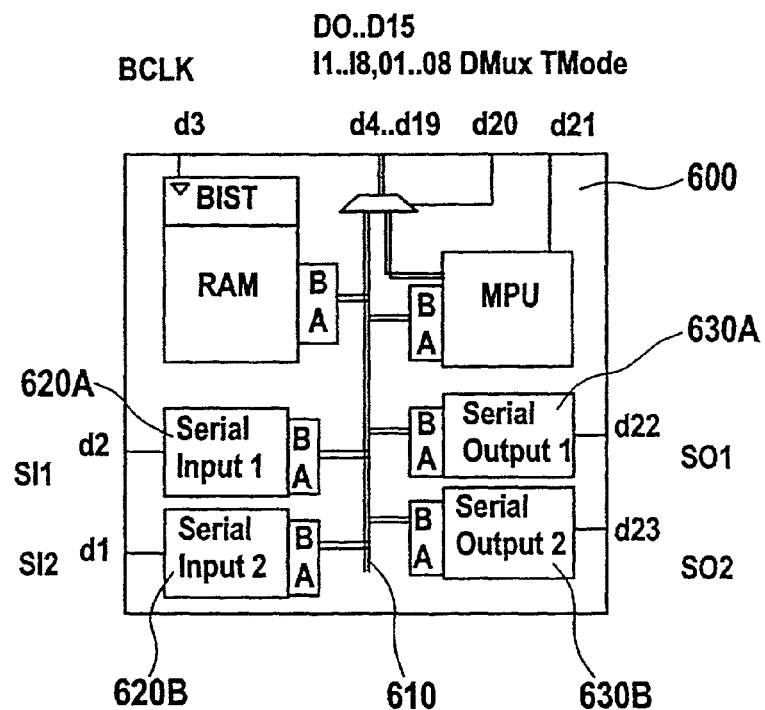
FIG. 6 shows a multi-port approach according to the invention applied for testing a SOC device as DUT 600.

FIG. 6 shows—in a more specific example—a multi-port approach according to the invention applied for testing a SOC device as DUT 600, such as a communication device. An implementation of multi-port tests for that DUT 600 is described in the following Chapter 5. The DUT 600 comprises 6 DUT-cores and has 23 DUT-pins d1–d23. The DUT 600 comprises—as DUT-cores—an embedded processor MPU, an embedded memory RAM, two serial input DUT-cores 620A and 620B, and two serial output DUT-cores 630A and 630B.

An internal 16-bit bus 610 (operating e.g. at 200 Mbit/s) enables a point-to-point communication between the DUT-cores. By means of bus-arbitration logic BA, two pairs of DUT-cores may concurrently stream data at 100 Mbit/s with each communication taking place in a 10 ns time slice. For the sake of easier understanding, various DUT-pins and internal signals useful or required for a true device shall not be considered here, specifically, the underlying clocking scheme.

As testability features, the DUT 600 provides:
access to the internal bus 610 through an external memory bus D0 . . . D15 (DUT-pins d4–d19) of the MPU, which is controlled by a DUT-pin DMux (DUT-pin d20),
a scan test mode of the MPU, which is controlled by a DUT-pin T-mode (DUT-pin d21), and
a Build-in-Self-Test engine BIST for the RAM, which is controlled through the internal bus 610 and clocked through a DUT-pin BCLK (DUT-pin d3).

In order to reduce testing time for the DUT 600, three multi-ATE-port tests may be implemented (e.g. by the user)— each of which tests two DUT-cores concurrently. Without going too far into implementation details, the following is an application-oriented description of the three tests:

Test 1: RAM and MPU tested concurrently in three testing sequences:
  a. Setup the BIST engine through a BIST-port (DUT-pins: BCLK, D0 . . . D15, DMux).
  b. Clock the BIST through a BIST-clocking-port (DUT-pin: BCLK) at-speed (200 MHz) while concurrently testing the MPU at a different slower test rate (e.g. 40 MHz) through an MPU test ATE-port (DUT-pins: I1 . . . I8, O1 . . . O8, TMode).
  c. Read the result signature of the BIST engine through the BIST-port (DUT-pins: BCLK, D0 . . . D15, DMux).

Test 2: The serial input DUT-core 620A and the serial output DUT-core 630A are tested concurrently through two high-speed serial ATE-ports (DUT-pins: SI1 and SO1) and the data ATE-port (DUT-pins: D0 . . . D15, DMux). The high-speed serial ATE-ports operate here at 800 Mbits/s. The data ATE-port concurrently compares the data received through SI1 and provides the parallel data to be output serially by SO1. This is achieved by time-slicing the per-ATE-port pattern through the data ATE-port—each time slice is a testing sequence with a particular assignment of ATE-ports to DUT-cores.

Test 3: The serial input DUT-core 620B and the serial output DUT-core 630B are tested in accordance with Test 2 as above. The same test setup applies to the data ATE-port, however, the test setup of ATE-ports (DUT-pins: SI1 and SO1) are replicated in the digital ATE-pins of ATE-port (DUT-pins: SI2 and SO2). Alternatively, if analog resources are needed to test the serial DUT-pins, then the same analog test resources might be routed to the DUT-pins SI2 and SO2 for this test.

Chapter 5: Implementation of Multi-port Tests

Prior to describing the implementation of the introduced multi-port concepts the ATE-configuration for the example of the multi-DUT-port test shall be clarified.

Figure 7:
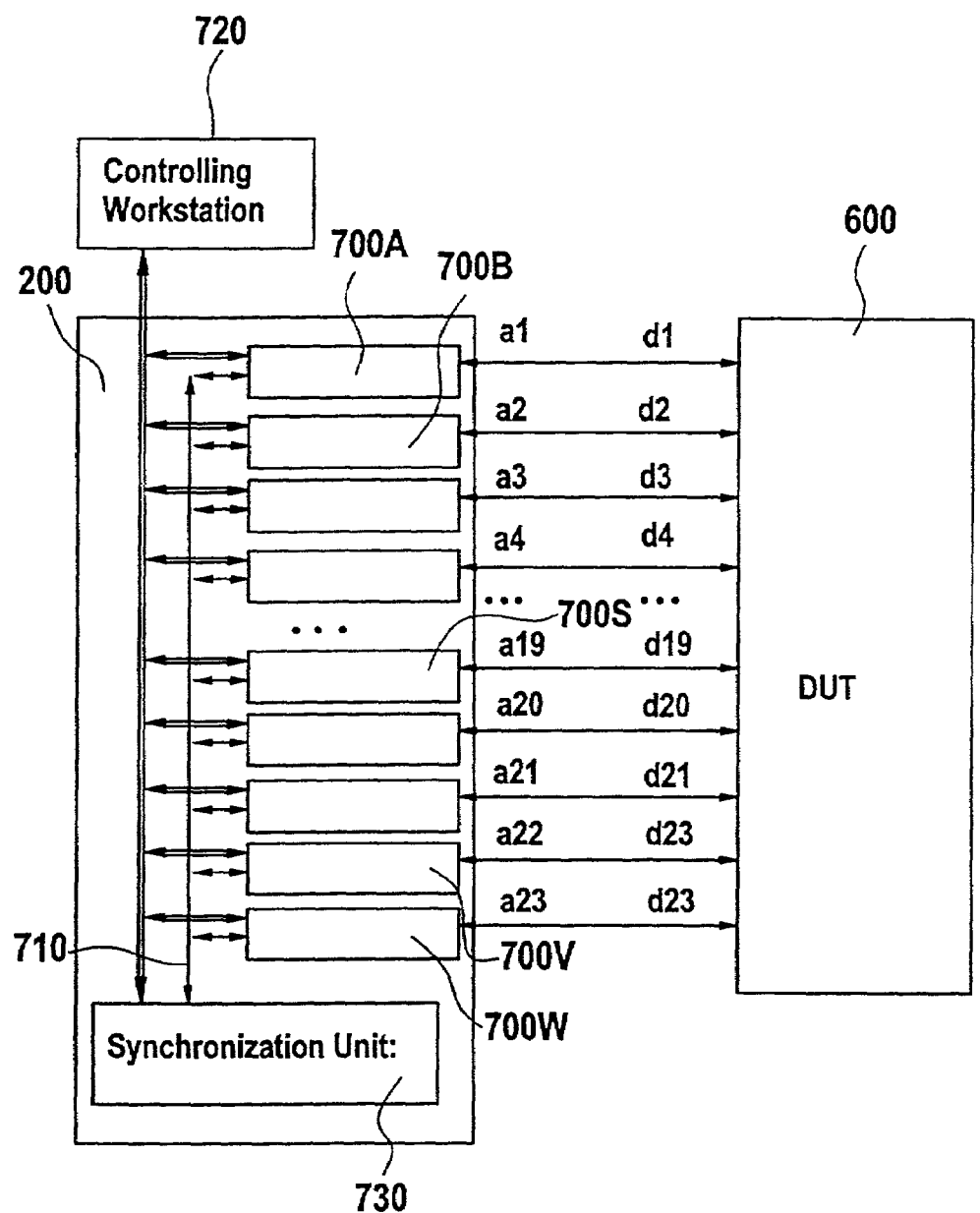
FIG. 7 depicts an example for the connection between the per-pin ATE 200 and the DUT 600.

FIG. 7 depicts an example for the connection between the per-pin ATE 200 and the DUT 600. Every DUT-pin d1–d23 of the DUT 600 is connected to a respective one of ATE-pins a1–a23. Each one of the ATE-pins a1–a23 represents the electrical contact towards the DUT 600 of a respective one of per-pin testing units 700A–700W of the ATE 200. Each per-pin testing unit 700 can operate independently besides a common synchronization bus 710 that primarily distributes a central clock. Without loosing generality, it shall be assumed that ATE-pin $a_i$ is connected to DUT-pin $d_i$, with i=1, 2, . . . , 23.

A controlling workstation 720 interfaces to the per-pin testing units 700 as well as shared components in the ATE 200 to download setup data or to upload result data. The controlling workstation 720 also starts test execution, but does not participate in the test execution that is under control of the per-pin testing units 700 with the help of a central synchronization unit 730.

An alternative configuration may use shared analog test resources of the ATE 200 to stimulate or capture the data of the high-speed serial DUT-pins $d_i$. In this case, a switching unit (e.g. a relay in the ATE 200) may enable for dynamically assigning the analog resources to respective DUT-pins. For the above given Test 2 (cf. the above chapter 2), an analog stimulation unit (ASU) might be connected to the DUT-pin SI1 (cf. FIG. 6) and an analog capture unit (ACU) might be connected to the DUT-pin SO1. Hence, the ASU implements ATE-port "SI1" while the ACU implements ATE-port "SO1". For the Test 2, they can be connected to the DUT-pin SI2 respectively SO2, hence implementing the ATE-port "SI2" respectively "SO2".

Figure 8:
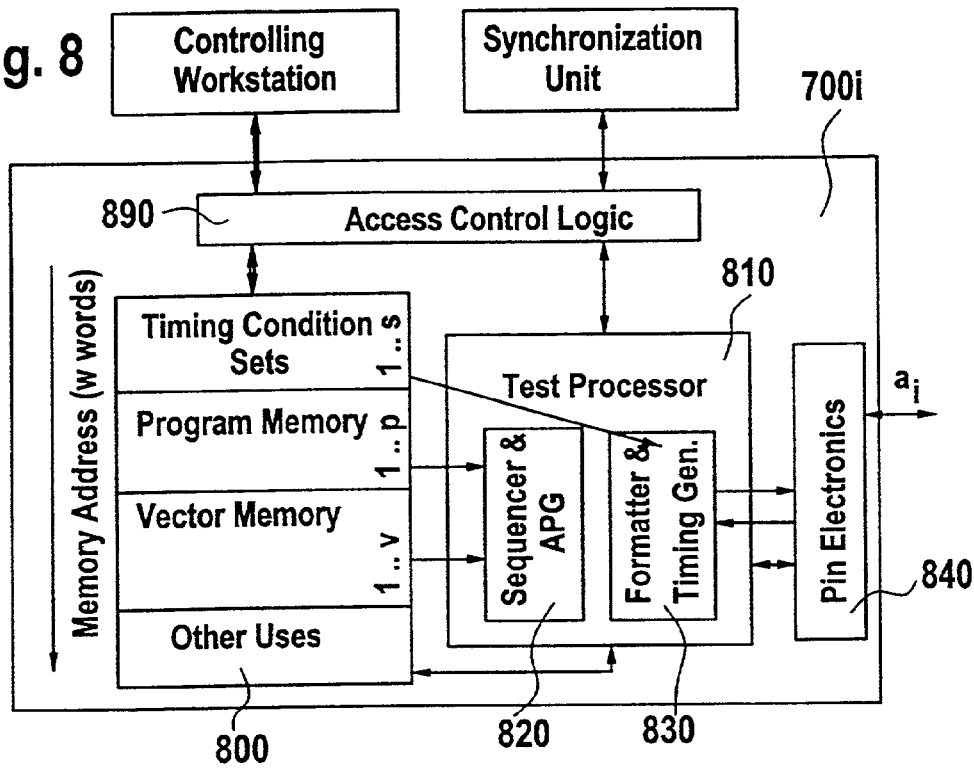
FIG. 8 is a schematic diagram of a digital per-pin testing unit 700$i$.

FIG. 8 is a schematic diagram of a digital per-pin testing unit 700$i$ with the ATE-pin $a_i$. As far as required here for the description of the present invention, the per-pin testing unit 700$i$ comprises the features:
A universal memory 800 of w words, which is used for storing:
  Timing condition sets (in this example: s sets).
  Program memory (in this example: p instructions) for sequencer and algorithmic pattern programs.
  Vector memory (in this example: v vectors) for pattern program.
  Other uses.
A test processor 810 with two main sub-components:
  a sequencer and algorithmic pattern generator (APG) 820 that reads program instructions and vector data out of the universal memory 800;
  a formatter and timing generator 830 that generates the drive and compare event sequence according to the currently active timing condition set.
A pin electronics 840 whose primary function is to drive signals to the DUT 600 and receive signals therefrom.
An interface of the per-pin testing unit 700$i$, with:
  an access control logic 890 that supports e.g. broadcasting to a subset of per-pin testing units (e.g. a subset constituting an ATE-port)

a global set of synchronization signals that are processed by the test processor a global bus that is primarily used by a controlling workstation to write to and read from the universal memory 800 of each per-pin testing unit 700*i*.

The invention dynamically integrates per-pin testing units 700*i* into a commonly programmed set of test units referred to as an ATE-port. Specifically, the memory management (e.g. of employed software) must allocate timing condition sets, program instructions, and vector memory that are structured on a per-ATE-port basis.

This implementation approach of a multi-port test becomes clearer when explaining how the three multi-port tests (Tests 1–3 of the above Chapter 4) of the fictitious DUT 600 are implemented.

Prior to implementing the multi-port tests, test conditions have to be specified that are used throughout the test program development, e.g.:

a. Which of the per-pin testing units 700*i* shall participate in the overall test, and how they are physically connected to the DUT 600. The DUT-global names a1 . . . a23 are defined for the ATE-pins of the per-pin testing units 700*i*. These names will be referred to later when defining the ATE-port-local pin names.

b. How the per-pin testing units 700*i* behave when idling during a test without influencing the test results of other concurrently active ATE-ports (e.g. drive a static signal).

Re. Test 1: Concurrent Test of RAM and MPU

The following describes the programming steps and how the system implements the used concepts:

a. Defining the ATE-ports (cf. FIG. 6) used during the test:
  BIST_PORT refers to DUT-pins BCLK, D0 . . . D15, and DMux. In order to uniquely identify a test resource, the mapping of names of DUT-pins for this ATE-port to the global pin names introduced before must be defined, e.g.:
    BLCK as alias for the per-pin testing units 700C with ATE-pin a3.
    D0 . . . D15 as alias for the per-pin testing units 700D–700S with ATE-pins a4–a19.
    DMux as alias for per-pin testing unit 700T with ATE pin a20.
  BIST_CLK_PORT refers to DUT-pin BCLK.
    BCLK as alias for the per-pin testing units 700C with ATE-pin a3.
  MPU_TEST_PORT refers to DUT-pins I1 . . . I8, O1 . . . O8, TMode.
    I1 . . . I8 as alias for the per-pin testing units 700D–700K with ATE-pins a4 . . . a11
    O1 . . . O8 as alias for the per-pin testing units 700L–700S with ATE-pins a12 . . . a19
    TMode as alias for the per-pin testing unit 700T with ATE-pin a20

Besides storing the ATE-port definition and the name mappings in an appropriate data structure, the invention configures the access control logic 890 of the per-pin testing units 700*i* to be able to store data or retrieve results by broadcasting.

b. For each ATE-port, the waveform table and equation sets have to be described (as shown in the above Chapter 2):
  BIST_PORT timing with 40 MHz frequency.
  BIST_CLK_PORT timing with 200 MHz frequency.
  MPU_TEST_PORT timing with 40 MHz frequency.

Since the timing requirements of a DUT-pin may stay unchanged although it is assigned to varying ATE-ports (e.g.

ATE-pin BCLK), a single waveform table and/or equation set might be specified for the superset of all ATE-pins in multiple ATE-ports. For example MPU_TEST_PORT and BIST_PORT may share a common wave-table and equation set for the 40 MHz frequency timing.

c. The test's overall timing condition specification blocks are described for the sets of concurrently active ATE-ports by referencing the previously defined waveform tables and equation sets (as described in the above Chapter 2).

For each specification block, the invention verifies that the timing can be implemented: e.g. that two active ATE-ports do not refer to the same ATE-pin or that the per-ATE-port periods can be implemented based on the central clock.

Using the pre-configured broadcast, the invention effectively downloads the timing definition for each ATE-port. Hence, the pins of an ATE-port have to share the same timing condition set for a specification block. This requires effective memory management of the timing condition sets to avoid wasting memory.

Figure 9:
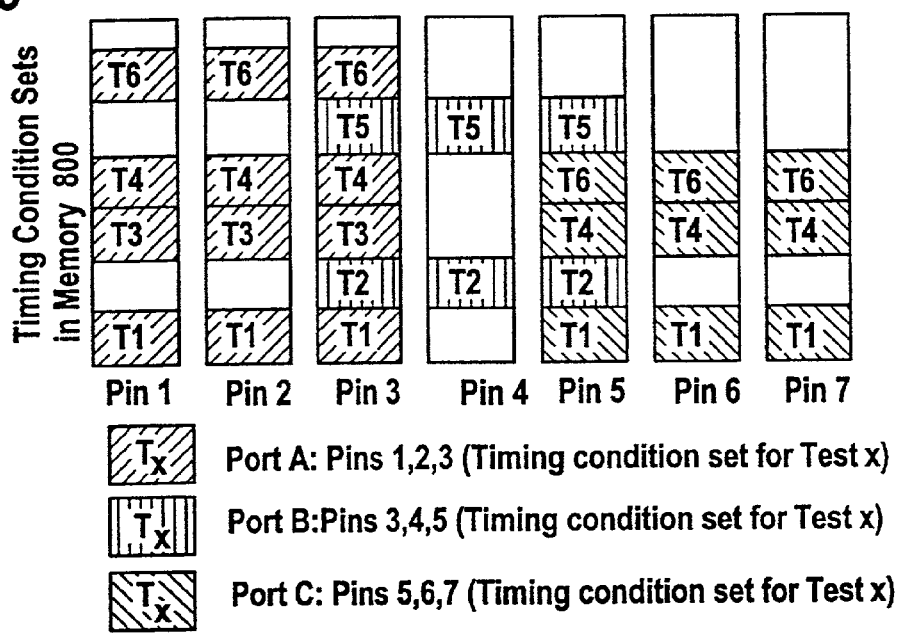
FIG. 9 illustrates how the software memory management uses the per-ATE-pin timing condition sets.

FIG. 9 illustrates how the software memory management uses the per-ATE-pin timing condition sets assuring that:
  per-ATE-pin timing condition sets that need to be activated concurrently for an ATE-port use the same memory location, hereby enabling fast modifications and activation of timing condition sets of an ATE-port;
  if possible, unused memory locations are filled by timing condition sets that are downloaded later: e.g. timing condition set for the last specification block (test 6) of ATE-port C fills an empty spot.

d. Per-ATE-port pattern programs are created for each step in the test (as described in the above Chapter 3).

e. The multi-port bursts are defined for each step in the test (as described in the above Chapter 3):
  Burst for ATE-port BIST_PORT with single pattern program to setup the BIST engine.
  Multi-port burst for ATE-ports BIST_CLK_PORT and MPU_TEST_PORT to clock the BIST engine (at 200 MHz) while testing the MPU (at 40 MHz) through the 8 scan chains accessible through I1 . . . I8 and O1 . . . O8. Assuming sufficient access to the RAM DUT-core, an APG pattern program might run concurrently to the MPU test and generate a bitmap.
  Burst for ATE-port BIST_PORT with single pattern program to read the result signature.

As for the timing condition sets, the software memory management uses the per-ATE-pin program memory 800 and vector memory assuring that:
  Per-ATE-pin pattern programs that need to be activated concurrently for a ATE-port use the same memory locations, hereby enabling fast modifications and activation of pattern program's of a ATE-port.
  If possible, unused memory locations are filled by pattern programs that are downloaded later.

f. In order to configure the first executable sub-test (setting up the BIST engine), the proper specification block and pattern program burst is selected. Similarly, the other two sub-tests are configured and these individual testing sequences are integrated into a single test.

g. It is specified that the test results should be logged and that the test flow should proceed according to whether this test passed or whether one or both DUT-cores (MPU or RAM) failed.

Re. Test 2: Concurrent Test of SI1 and SO1

Initially, the same steps as for the Test 1 are followed:
a. Defining the ATE-ports used during the test:
  DATA_PORT refers to ATE-pins D0 . . . D15, DMux
  CORE_PORT refers to ATE-pins D0 . . . D15
  SI1_PORT refers to ATE-pin SI1
  SI2_PORT refers to ATE-pin SI2 (used for Test 3)
  SO1_PORT refers to ATE-pin SO1
  SO2_PORT refers to ATE-pin SO2 (used for Test 3)
b. Specifying the per-ATE-port waveform table and equation set:
  DATA_PORT timing with 200 MHz frequency: DATA_PORT_TIM
  SI1_PORT timing with 800 MHz frequency: SI_PORT_TIM
  SO1_PORT timing with 800 MHz frequency: SO_PORT_TIM
c. Defining the specification block integrating the per-ATE-port timing conditions of the three ATE-ports.
d. Creating per-ATE-port pattern programs. Two DUT-cores SI1 and SO1 are accessed through a single ATE-port DATA_PORT, which requires interleaving the data for the DUT-cores.

The data might be interleaved when generating the per-ATE-port pattern program for DATA_PORT. Alternatively, the invention supports maintaining the DUT-core data independently while flexibly defining the DUT-core access protocol. It is to be provided:

The ATE-pattern program of each DUT-core for a specified ATE-port ("core access ATE-port"). This type of pattern, generating the stream of DUT-core data, is referred to as "DUT-core pattern". In our example two DUT-core pattern would have to be specified—both interfacing to the DUT-core through the DUT-core access ATE-port CORE_PORT.

A main pattern program that:
  is defined for an ATE-port that is a superset of all ATE-pins needed for the DUT-core access;
  identifies the DUT-core patterns that need to be integrated;
  generates the DUT-core access protocol pattern independent of the DUT-core data;
  selects DUT-core data generated by the DUT-core pattern program as appropriate within the DUT-core access protocol (for the DUT-core access ATE-port specified by the DUT-core pattern).

FIG. 10 depicts an example of a main pattern that implements the concurrent DUT-core access for two DUT-cores. In vector 0, the DUT-core pattern "SI1_Data" and "SO1$_{13}$ Data" are referenced such that in vector 1 and 3 the system can dynamically reconfigure the ATE to generate the DUT-core data at the DUT-core access ATE-port for the respective DUT-core (indicated by "p" in the table). In this example, the DUT-core access ATE-port CORE_PORT is used for both DUT-core pattern "SI1_Data" and "SO1_Data".

The contribution of this part for the invention is that:
  The ATE-port configuration can be switched from one sub-test to another, but also within a pattern program. Hence, testing sequences can extend from a single test period up to complete tests.
  The DUT-core pattern are maintained independent from the DUT-core access protocol—hereby supporting:
    of DUT-core pattern,
    interleaving of pattern data to maximize utilization of the available bandwidth and ultimately reducing test execution time by parallel testing of multiple DUT-cores.
e. Defining a multi-port burst for the test (as described in Chapter 3). There are three ATE-ports that are concurrently active (Port Execution Context):
  DATA_PORT with the main pattern program referencing the DUT-core patterns. The ATE-port pattern program will be referred to as DATA_PORT_PAT.
  SI1_PORT driving the serial data stream to the external DUT-pin of the serial input DUT-core. This ATE-port pattern program will be referred to SI1_PORT_PAT.
  SO1_PORT comparing the serial data stream from the external DUT-pin of the serial output DUT-core with the expected data. This ATE-port pattern program will be referred to SO_PORT_PAT.
f. Selecting the proper specification block and the multi-port burst to configure the test (as described in Chapter 3).
g. Specifying that the test results should be logged and that the test flow should proceed according to whether this test passed or whether one or both DUT-cores (SI1 or SO1) failed.

Re. Test 3: Concurrent Test of SI1 and SO1

This test may be implemented as Test 2 by copying the test setup of ATE-port SI1_PORT respectively SO1_PORT to ATE-port SI2_PORT respectively SO2_PORT. The main pattern program referencing the DUT-core patterns may be reused without change assuming that DUT-core SI2 and SO2 behave identical to DUT-cores SI1 and SO1.

Beyond simple copy operations, the invention allows specifying shared per-ATE-port timing or pattern program for multiple ATE-ports.

For the fictitious DUT, the ATE-pin mapping between the ATE-pins in ATE-port SI1_PORT and SI2_PORT as well as between the ATE-pins in ATE-port SO1_PORT and SO2_PORT is to be defined. Based on this "alias" mapping, it can then be specified that:
  SI_PORT_TIM and SI_PORT_PAT apply to SI1_PORT as well as to SI2_PORT.
  SO_PORT_TIM and SO_PORT_PAT apply to SO1_PORT as well as to SO2_PORT.

Besides selecting ATE-ports SI2_PORT and SO2_PORT when defining the timing specification block and the ATE-port execution context of the multi-port burst, the setup of Test 3 is identical to the test setup of Test 2.

The support of the invention for applying a single test setup component to multiple ATE-ports contributes by:
  reducing the amount of test data to be generated (e.g. by the user),
  forcing consistency between test setup component for multiple ATE-ports that should be identical,
  enabling optimized data storage by storing a single copy of the shared test setup component,
  enabling optimized data transfer by broadcasting the test setup to the ATE-pins sharing this setup.

What is claimed is:
1. An automated test equipment (ATE) comprising:
  a plurality of per-pin testing units, wherein each of said plurality of per-pin testing units has circuitry for at least one of emitting a signal to, or receiving a signal from, a pin of a device under test (DUT) having a plurality of DUT pins, and wherein, during a testing sequence, said DUT is defined as (a) a first DUT core that represents a first functional unit of said DUT and (b) a second DUT core that represents a second functional unit of said DUT;

an assigning component that assigns, during said testing sequence, (a) a first subset of said plurality of per-pin testing units to a first ATE-port, for interfacing with said first DUT core via a first subset of said plurality of DUT pins, and (b) a second subset of said plurality of per-pin testing units to a second ATE-port, for interfacing with said second DUT core via a second subset of said plurality of DUT pins; and a programming component that (a) obtains a first specification for testing said first DUT core, prepares a first program based on said first specification, and programs said first ATE-port with said first program, and (b) obtains a second specification for testing said second DUT core, prepares a second program based on said second specification, and programs said second ATE-port with said second program, wherein said first and second ATE-ports are sequenced independently of one another during execution of said first and second programs.

2. The automated test equipment of claim 1, wherein said assigning component comprises:

a component that switches connections between one or more of said plurality of per-pin testing units and one or more of said plurality of DUT pins; and a component that controls said switching in accordance with said assigning of said first and second subsets of said plurality of per-pin testing units.

3. The automated test equipment of claim 1, wherein said programming component comprises:

main pattern programs for implementing access protocols to said first DUT core.

4. The automated test equipment of claim 3, wherein said main pattern program comprises at least one of:

a component that configures said first ATE-port for activating said first subset of said plurality of per-pin testing units for accessing said first DUT core; and a component that selects pattern data generated by pattern programs of said first DUT core during one testing sequence for testing said first DUT core.

5. The automated test equipment of claim 1, wherein said programming component comprises:

a component that defines an alias mapping between said plurality of per-pin testing units for a plurality of ATE-ports, and specifies at least one of timing information and a pattern program of said first ATE-port to apply for said plurality of ATE-ports for which said alias mapping is defined.

6. The automated test equipment according to claim 1, further comprising a component that specifies overall test conditions for a test that concurrently operates on multiple ATE-ports.

7. The automated test equipment of claim 6, wherein said component that specifies overall test conditions comprises at least one of:

a component that determines a set of concurrently active ATE-ports during a defined testing sequence;

a component that selects ATE-port test conditions for one or more ATE-pins, for selecting an ATE-port timing setup for one or more ATE-pins;

a component that specifies global test conditions to express dependencies between pins of said DUT and said ATE; and a component that determines a multi-port pattern burst as a sequence of per-ATE-port pattern programs for each ATE-port.

8. The automated test equipment of claim 1, wherein said first ATE-port sequences through branching conditions of said first program, independently of sequencing by said second ATE-port.

9. The automated test equipment of claim 1, wherein each of said first subset of said plurality of per-pin testing units includes an interface for communicating with interfaces of other per-pin testing units of said first subset.

10. A method for testing a device under test (DUT) with automated test equipment (ATE) having a plurality of per-pin testing units, wherein each of said plurality of per-pin testing units has circuitry for at least one of emitting a signal to, or receiving a signal from, a pin of said DUT, said method comprising:

defining, for a testing sequence, (a) a first DUT core that represents a first functional unit of said DUT, and (b) a second DUT core that represents a second functional unit of said DUT;

assigning, during said testing sequence, (a) a first subset of said plurality of per-pin testing units to a first ATE-port, for interfacing with said first DUT core via a first subset of said plurality of DUT pins, and (b) a second subset of said plurality of per-pin testing units to a second ATE-port, for interfacing with said second DUT core via a second subset of said plurality of DUT pins;

obtaining a first specification for testing said first DUT core, and a second specification for testing said second DUT core;

preparing a first program based said first specification, and a second program based on said second specification; and programming said ATE-port with said first program, and said second ATE-port with said second program, wherein said first and second ATE-ports are sequenced independently of one another during execution of said first and second programs.

11. The method according to claim 10, further comprising:

specifying overall test conditions for a test that concurrently operates on multiple ATE-ports.

12. The method of claim 11, wherein specifying overall test conditions comprises:

determining a set of concurrently active ATE-ports during a defined testing sequence;

selecting ATE-port test conditions for one or more ATE-pins;

specifying global test conditions to express dependencies between pins of said DUT and said ATE; and determining a multi-port pattern burst as a sequence of per-ATE-port pattern programs for each ATE-port.

13. A data media for storing computer instructions for automated test equipment, said data media comprising:

instructions for testing a device under test (DUT) with automated test equipment (ATE) having a plurality of per-pin testing units, wherein each of said plurality of per-pin testing units has circuitry for at least one of emitting a signal to, or receiving a signal from, a pin of said DUT, wherein said DUT includes a plurality of DUT pins;

instructions for defining, for a testing sequence, (a) a first DUT core that represents a first functional unit of said DUT, and (b) a second DUT core that represents a second functional unit of said DUT; and instructions for assigning, during said testing sequence,
(a) a first subset of said plurality of per-pin testing units to a first ATE-port, for interfacing with said first DUT core via a first subset of said plurality of DUT pins, and
(b) a second subset of said plurality of per-pin testing units to a second ATE-port, for interfacing with said second DUT core via a second subset of said plurality of DUT pins;

instructions for obtaining a first specification for testing said first DUT core, and a second specification for testing said second DUT core;

instructions for preparing a first program based said first specification, and a second program based on said second specification; and instructions for programming said first ATE-port with said first program, and said second ATE-port with said second program, wherein said first and second ATE-ports are sequenced independently of one another during execution of said first and second programs.

* * * * *